United States Patent [19]

Ejim

[11] Patent Number: 4,946,544

[45] Date of Patent: Aug. 7, 1990

[54] CRYSTAL GROWTH METHOD

[75] Inventor: Theophilus I. Ejim, Fairless Hills, Pa.

[73] Assignee: AT&T Bell Laboratories, Murray Hill, N.J.

[21] Appl. No.: 315,667

[22] Filed: Feb. 27, 1989

[51] Int. Cl.[5] .................... C30B 11/02; C30B 17/00; C30B 27/00; C30B 29/40

[52] U.S. Cl. .......................... 156/616.41; 156/616.2; 156/616.3; 156/607; 156/DIG. 70; 422/248

[58] Field of Search ............... 156/607, 616.1, 616.2, 156/616.3, 616.4, 616.41, 617.1, DIG. 70; 422/248

[56] References Cited

U.S. PATENT DOCUMENTS

| | | | |
|---|---|---|---|
| 3,301,637 | 1/1967 | Kucza et al. | 156/DIG. 70 |
| 3,520,810 | 7/1970 | Plaskett et al. | 156/DIG. 70 |
| 3,649,193 | 3/1972 | Deyris | 156/616.41 |
| 3,877,883 | 4/1975 | Berkman et al. | 156/616.41 |
| 3,898,051 | 8/1975 | Schmid | 156/616.41 |
| 4,404,172 | 9/1983 | Gault | 422/248 |
| 4,840,699 | 6/1989 | Khattak et al. | 156/616.41 |

OTHER PUBLICATIONS

Bachmann, K. J. and Buehler, E., "Phase Equilibria and Vapor Pressures of Pure Phosphorus and of the Indium/Phosphorus System and Their Implications Regarding Crystal Growth of InP," *J. Electrochem. Soc.: Solid-State Science and Technology*, vol. 121, No. 6, Jun. 1974, pp. 835–846.

Pamplin, Brian R., "Growth of Single Crystals of GaAs in Bulk and Thin Film Form," *Crystal Growth*, Pergamon Press Ltd., 1975, p. 165.

*Primary Examiner*—Gary P. Straub
*Attorney, Agent, or Firm*—Roderick B. Anderson

[57] ABSTRACT

The problem of spurious inclusions of excess Group V material in the growth of III-V crystals is reduced by including, along with the raw material (12) in the crucible, a quantity (13) of the elemental Group V material and encapsulating with boric oxide (14). The crucible is contained within a growth vessel (19) which is in turn contained within a pressure vessel (16) which is first evacuated and then filled to a high pressure with an inert gas such as argon. The inert gas is one which is lighter in weight than the vaporized Group V material, and which is at a higher pressure than the equilibrium pressure of the vaporized Group V material at the melting temperature of the III-V compound. The vaporized Group V material displaces the argon in the growth vessel (19). The inventive process also reduces defects in the grown crystal.

7 Claims, 1 Drawing Sheet

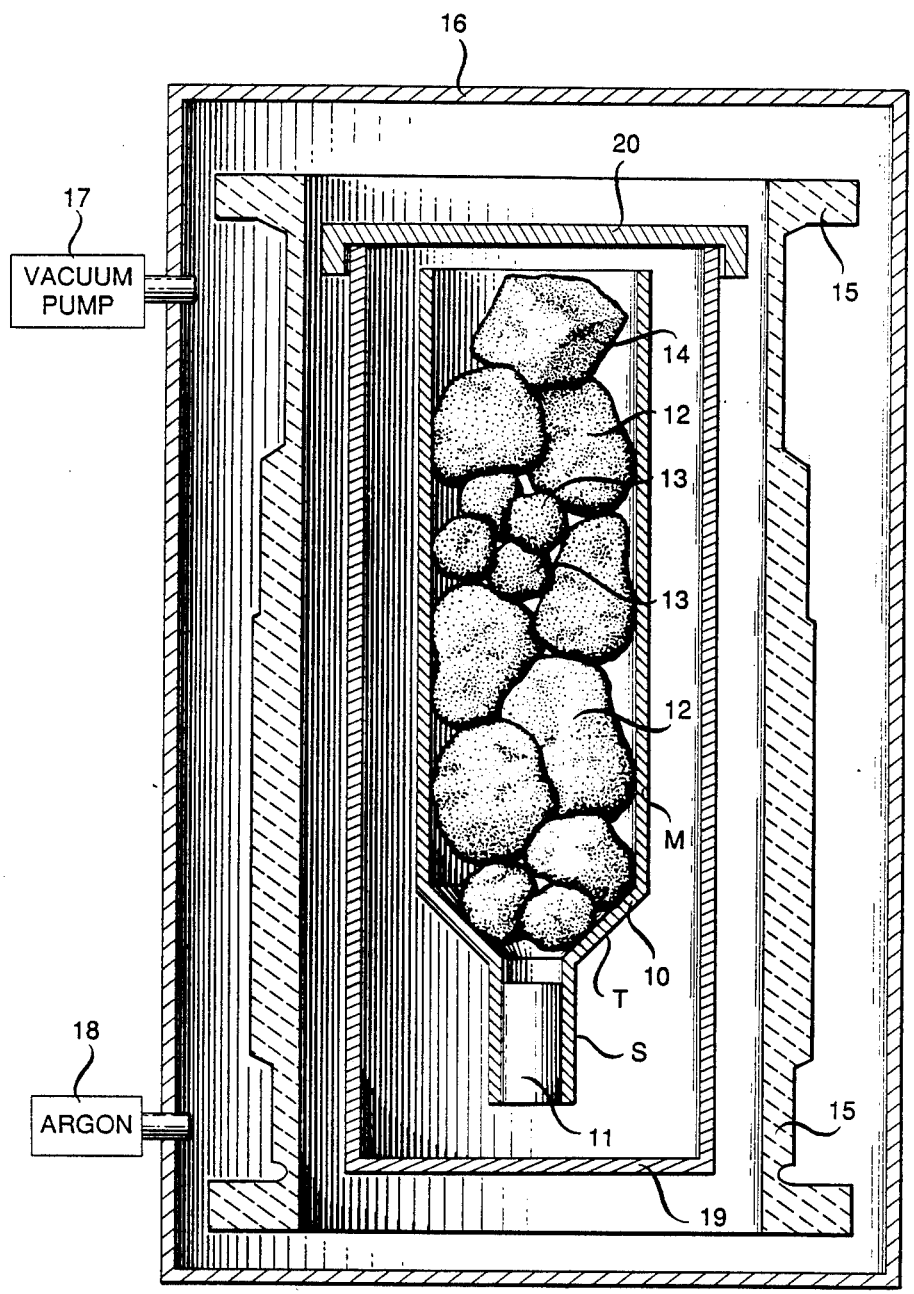

CRYSTAL GROWTH METHOD

TECHNICAL FIELD

This invention relates to processes for growing large single-crystal semiconductors and, more particularly, to processes for growing large single crystals of Group III–V semiconductor compounds.

BACKGROUND OF THE INVENTION

One of the most significant developments in semiconductor technology in recent years has been the increased use and importance of compound semiconductors. Particularly significant are the Group III–V compound semiconductor devices composed of elements of Groups III and V of the periodic table, such as gallium arsenide (GaAs) and indium phsophide (InP). Compound semiconductors are used in such devices as lasers, light-emitting diodes, microwave oscillators and amplifiers, and various types of light detectors.

Most such commercial use of compound semiconductors requires the growth of large single-crystal ingots from which wafers can be cut for the subsequent fabrication of useful devices. One of the more promising methods for such crystal growth is the Vertical Gradient Freeze (VGF) method, particularly the VGF method defined in the U.S. pat. No. of W. A Gault, 4,404,172, granted Sept. 13, 1983 and assigned to Western Electric Company, Inc., which is hereby incorporated herein by reference. According to this method, polycrystalline starting material is placed in a vertically extending crucible including a small cylindrical seed well portion at its bottom end which snugly contains a monocrystalline seed crystal. Initially, the starting material and a portion of the seed crystal are melted. The power to the system is then reduced in such a manner that freezing proceeds vertically upwardly from the seed crystal. One major advantage of the VGF method is that, by using low thermal gradients, crystals with very low dislocation densities can be produced. Another advantage is that the crystal growth rate be changed with no effect on the crystal diameter.

It is well-known that the Group III–V compounds tend to dissociate at higher temperatures, with the more volatile Group V element escaping into the vapor phase. Several approaches have been developed to prevent or retard this tendency during crsytal growth. In one approach, escape of the more volatile Group V component is retarded by providing a vapor pressure of Group V vapor over the melt from a sperately heated reservoir of Group V material within the sealed growth container. It is also knwon that Group V material loss from the melt may be retarded with the use of any of various materials such as boric oxide ($B_2O_3$), barium chloride ($BaCl_2$), or calcium chloride ($CaCl_2$) which act as diffusion barriers. Such additives, having a lower density than the molten indium phosphide, rise to the surface, encapsulate the melt, and, together with an inert gas pressure in the vessel, can contain the volatile vapors; see, for example, the paper of "Growth of Single Crystals of GaAs in Bulk and Thin Film Form," by B. A. Joyce, included in the book, *Crystal Growth*, edited by B. R. Pamplin, Pergamon Press, 1975, pp. 157–184 at p. 165.

The use of boric oxide as a diffusion barrier can sometimes lead to a fully stoichiometric crystal. But in most cases there is some loss of the volatile Group V material, resulting in excess Group III inclusions in the last-to-freeze portion of the crystal. "Inclusion," as is known in the art, is a small volume within the crystal structure having an excess of one of the constituents or of impurity atoms, e.g., an excess of indium in indium phosphide.

The use of a separately heated reservoir of Group V material has been found to require relatively large amounts of the Group V material for each crystal growth run. The pressure vessel must be cleaned frequently because most of the Group V material sublimes and deposits on the cold surface of the pressure vessel. Also, the requirement of a second heater consitutes an added cost and complication to the system.

SUMMARY OF THE INVENTION

I have found that the foregoing problems can be eliminated or reduced by including, along with the raw material in the crucible, a quantity of the elemental Group V material. That is, in the growth of indium phosphide, a quantity of pure phosphorous is included in the crucible along with the polycrystalline raw material. During growth of the crystal, the crucible is exposed to a high over-pressure, for example in excess of 26 atmospheres, of an inert gas such as argon. As will be described more fully later, the inert gas is one which is lighter in weight than the vaporized Group V material, and which is at a higher pressure than the equilibrium vapor pressure of the Group V material at the melting point of the compound semiconductor.

These and other objects, features, and advantages of the invention will be better understood from a consideration of the following detailed description taken in conjunction with the accompanying drawing.

BRIEF DESCRIPTION OF THE DRAWING

The FIG. shows a schematic sectional view of a crucible contained within a pressure vessel for growing a single-crystal ingot of a compound semiconductor material in accordance with an illustrative embodiment of the invention.

DETAILED DESCRIPTION

Referring now to the FIG., there is shown schematically a crucible of the type used in the VGF process for growing large single crystals of compound semiconductors, particularly III–V semiconductors such as indium phosphide (InP). The crucible 10 comprises a generally cylindrical major portion M, a frustoconical transition portion T, and a cylindrical seed well portion S, and is arranged vertically with the seed well portion at the bottom, as shown. As described in detail in the aforementioned U.S. Pat. No. of W. A. Gault, a cylindrical monocrystalline seed crystal 11 of the material to be grown is snugly fitted into the seed well portion S. Most of the remaining part of the crucible is then filled with a quantity 12 of a non-monocrystalline form of the crystal to be grown, such as polycrystals of InP.

In accordance with the invention, also included with the raw material is a quantity 13 of the elemental form of the Group V component of the III–V semiconductor being grown. For example, if indium phosphide is to be grown, the material 13 is elemental phosphorus, preferably red phosphorus. As is practiced in other crystal growth methods, there may be included within the crucible a quantity 14 of boric oxide which acts as an encapsulant as will be described later.

Surrounding the crucible is a heater 15 which is capable of melting the raw material and cooling it in a controlled manner in accordance with the VGF process. The crucible and heater are both contained within an airtight pressure vessel 16 from which air can be pumped by a vacuum pump 17 and into which argon can be pumped from an argon source 18. It is understood that the heater and pressure vessel are only shown schematically; apparatus not shown is used for controlling the temperature gradient within the crucible in accordance with the aforementioned Gault patent.

The crucible 10 is contained within a growth vessel 19 having a cover 20. The cover 20 is shown as being loosely-fitting to indicate that the growth vessel is not a sealed or airtight vessel.

In accordance with the VGF process, the heater 15 is first used to melt the boric oxide 14, the polycrystalline indium phosphide 12 and part of a monocrystalline seed crystal 11. After the indium phosphide raw material has been melted, the boric oxide floats to the top of the melt so as to encapsulate it. After all of the raw material and part of the seed crystal 11 has been melted, the power to the heater 15 is reduced such tht the semiconductor solidifies or freezes on the remaining seed crystal, and such solidification proceeds vertically upwardly. If the process proceeds as intended, the entirety of the molten indium phosphide will solidify to a single monocrystalline crystal, with the crystal orientation determined by that of the seed crystal.

In accordance with the invention, the crucible contains pure phosphorus 13 which sublimes to gaseous phosphorus at a temperature below the melting point of the indium phosphide 12. Prior to the sublimation, the vacuum pump 17 is used to evacuate the pressure vessel 16 to the range typically of 50–300 microns of mercury. Next, argon is pumped into the pressure vessel to a high pressure to retard the escape of vaporized phosphorus from the crucible. Thereafter, part of the phosphorus vapor combines with the indium phosphide melt from which the single crystal of indium phosphide is grown. It is important to note that there is no reservoir of vaporized Group V material external to the crucible as in the Gault patent. Therefore, the second heater used in the Gault patent to heat the phosphorus reservoir is not employed in this embodiment of the invention.

In accordance with the invention, the gas which is selected to fill the pressure vessel 16 has a lighter molecular weight than that of the vaporized Group V material, in this case phosphorus. The phosphorus vapor molecules either contain four atoms of phosphorus ($P_4$) or two atoms ($P_2$); the phosphorus vapor is therefore denser than the argon gas. Further, the pressure vessel should be filled to a pressure that exceeds that of the equilibrium pressure of phosphorus at the temperature of the melt, i.e., the pressure at which the number of phosphorus molecules leaving the melt are equal to the number of phosphorus molecules entering the melt. Since much research has been done on the problem of vaporized phosphorus leaving an indium phosphide melt, it is known that the equilibrium pressure of phosphorus is approximately 26 atmospheres. See, for example, the paper "Phase Equilibria and Vapor Pressures of Pure Phosphorus and of the Indium/Phosphorus System and the Implications Regarding Crystal Growth of InP," *Journal of the Electrochemical Society: Solid-State Science and Technology*, Volume 121, No. 6, June, 1974, pps. 835–846. Thus, the pressure of the argon in the pressure vessel 16 exceeds 26 atmopsheres.

When the phosphorus is initially vaporized, it is of the $P_4$ form, and at higher temperatures it becomes a mixture of the $P_4$ and $P_2$ forms. Since the phosphorus vapor is heavier than the argon, it will settle to the bottom of the crucible. Some of the elemental phosphorus should vaporize and therefore displace most of the argon in the crucible 10 and growth vessel. This leads to a very high partial pressure of phosphorus vapor over the indium phosphide polycrystals prior to and during melting. The cover 20 impedes the flow of phosphorus vapor and tends to restrict it to the growth vessel 19, while permitting the lighter argon to flow to the outer pressure vessel 16. Thus, unlike the Gault process, there is little or no deposit of elemental phosphorus on the pressure vessel inner walls after the process is completed.

In a typical VGF process, 1.7 kilograms of the raw indium phosphide 12 are used in a pyrolitic boron nitride crucible, along with 20 grams of red phosphorus and 100 grams of $B_2O_3$. During a ramp-up time of 2½ hours, the temperature is increased in the crucible to 400° C., while the vacuum pump 17 evacuates the pressure vessel. During the following one hour, the pressure vessel is pressurized to 50 atmospheres of argon. The temperature is then increased to the melting point of indium phosphide. The high zone heater configuration is such that when all the polycrystalline material 12 has melted, the temperature is somewhat lower in the seed well portion S so that only part of the seed crystal is melted. Thereafter, the crucible is cooled at cooling rates that can range from 0.5° C. to 100° C. per hour.

Not shown in the drawing are various thermal conductors and parts of the heating element of imparting a vertical temperature gradient to the crucible such that solidification initially occurs at the interface between the molten charge material and the solid monocrystalline seed crystal 11 and thereafter proceeds slowly upwardly in a vertical direction such that the last portion of the ingot to freeze or crystallize is the top-most portion. These structural details are described in the aforementioned Gault patent.

In virtually all indium phosphide ingots made by the applicant without including directly in the melt the elemental phosphorus 13, the last-to-freeze portion, or the top of the ingot, had excess elemental indium inclusions. With the phosphorus 13 included as described, the entirety of each ingot including the top could be made stoichiometric or to have a slight excess of phosphorus and to be substantially free of inclusions. Increasing the argon pressure in the pressure vessel, increasing the elemental phosphours in the crucible, and using a boric oxide encapsulant all contribute to making the ingot tend toward phosphorus richness. By the same token, reducing any of these parameters tends to make the ingot exhibit indium inclusions at the last-to-freeze portion. The illustrative ratio of P to InP of 1/85 (by weight) may be taken as being typical but not essential since its benefits are related to other parameters.

There is also an abservable reduction in the frequency of "twinning" in the crystals grown with my technique. (As is known in the art, "twinning" refers to a planar defect that may occur in a growing crystal.) This reduction was especially pronounced in the crucible transition region T where the seed crystal grows out at an angle until reaching the nominal crucible diameter cross section. Three sets of "friendly" twins which exit the crystal on the same side from which they initiated were usually present at 120° apart in the <111> crystal grown in the usual manner. Ten of the eleven ingots grown with solid phosphorus added directly to the charge did not exhibit these three sets of twins. Of the crystals that had a phosphorus-rich top zone, only two had two sets of "friendly" twins at the transition region and two had "unfriendly" twin lamallae that cut across the ingot and altered the seeded orientation. The result seems to indicate that if the melt is too phosphorus-rich, the crystal exhibits "unfriendly" twins, but at an appropriate level of phosphorus-richness, twinning in general is reduced substantially.

From the foregoing, one can appreciated that, not only can one obtain ingots that are significantly freer of inclusions of excess indium through the use of my invention, but ingots having a lower incidence of serious defects can be obtained. This lower incidence runs counter to the conventional thinking in III-V crystal growing that defect reduction requires special care to avoid introducing into the melt any impurities or foreign materials except the III-V raw material in its cleanest form and an encapsulant that will float to the top of the melt. The invention also reduces the amount of phosphorus that is needed for each crystal growth, and eliminates the need for an external heater. While the invention has been discussed in the context of the Vertical Gradient Freeze method, other methods such as the Vertical Bridgman method, the Vertical Stockbarger method, and the Horizontal Bridgman and Horizontal Stockbarger method could all be enhanced by adding the elemental Group V element directly to the melt as indicated above. It appears that a suitable pressure chamber in conjunction with any of these methods could be devised and that similar improvements could be obtained. Various other embodiments and modifications of the invention may be devised by those skilled in the art without departing from the spirit and scope of the invention.

I claim:

1. A process for making crystalline III-V material comprising:
   introducing into the bottom end of a vertically-extending crucible a relatively small monocrystalline seed crystal of III-V material, the top end of the crucible being open;
   introducing over the seed crystal a quantity of the III-V material in polycrystalline form and a quantity of an elemental group V material, the elemental group V material being of the same element which forms part of the III-V material;
   heating the crucible to melt the quantity of III-V material and the quantity of group V material to form a melt;
   the heating step resulting in the vaporization of at least part of the quantity of group V material;
   applying an external pressure of gas to the surface of the melt, the gas being of a material having a lower density than that of the group V material and which does not significantly react with the III-V material or the elemental group V material;
   the applied gas pressure exceeding a pressure equal to about the equilibrium pressure of the vaporized group V element at the melting temperature of the III-V material;
   containing vapor of the group V element in a volume above and contiguous to the surface of the melt;
   and freezing the III-V material such that at least a major portion of it extends as a single crystal from the seed crystal;
   the freezing step comprising the step of reducing the temperature in the crucible such that freezing proceeds from the seed end of the crucible toward the open end;
   the quantity of elemental group V material introduced into the crucible being sufficient such that vaporized group V material displaces at least part of the gas in the volume over the surface of the melt during substantially the entire freezing step;
   the quantity of elemental group V material introduced into the crucible and the applied gas pressure together being insufficient to cause a significant richness of group V material in the frozen III-V crystal.

2. The process of claim 1 further characterized in that:
   the pressure vessel contains a loosely-covered growth vessel which in turn contains the crucible;
   and the vaporized red phosphorus substantially completely displaces the argon in the crucible and the growth vessel.

3. The process of claim 2 further characterized in that:
   the total pressure of the vaporized phosphorus and argon on the crucible after the indium phosphide has melted exceeds about 50 atmoshperes.

4. The process of claim 1 further characterized in that:
   the Group III-V material is indium phosphide, the Group V elemental material is red phosphorus, and the applied gas pressure exceeds about 26 atmospheres.

5. The process of claim 1 further characterized in that:
   during the melting and freezing of the indium phosphite material, the total vapor pressure on the molten material resulting from the gas and vaporized phosphorus is about 50 atmospheres.

6. The process of claim 5 further characterized in that:
   the gas is argon which, prior to melting of the indium phosphite, is pumped into the pressure vessel to a pressure of about 50 atmospheres.

7. The process of claim 1 further characterized in that an encapsulant selected from the group of boric oxide, barium chloride and calcium chloride is also introduced into the crucible.

* * * * *

UNITED STATES PATENT AND TRADEMARK OFFICE
CERTIFICATE OF CORRECTION

PATENT NO.  : 4,946,544

DATED       : August 7, 1990

INVENTOR(S) : T. I. Ejim

It is certified that error appears in the above—identified patent and that said Letters Patent is hereby corrected as shown below:

ON TITLE PAGE:
Page 1, Column 2, line 1, in the Abstract
    after "Group" change "V" to --III--.

Column 3, line 23, after "such" change "tht" to --that--;

Column 4, line 7, after "vessel" insert --19--;

Column 4, line 32, after "element" change "of" to --for--;

Column 4, line 50, change "phosphours" to --phosphorus--;

Column 4, line 58, change "abservable" to --observable--.

Column 5, line 12, change "appreciated" to --appreciate--.

Signed and Sealed this

Thirty-first Day of December, 1991

*Attest:*

HARRY F. MANBECK, JR.

*Attesting Officer*  *Commissioner of Patents and Trademarks*